United States Patent
Fang et al.

(10) Patent No.: US 8,732,631 B2
(45) Date of Patent: May 20, 2014

(54) SYSTEM AND METHODS FOR HANDLING VERIFICATION ERRORS

(71) Applicant: Synopsys, Inc., Mountain View, CA (US)

(72) Inventors: Min-Yi Fang, HsinChu (TW); Kai-Jyun Nian, Changhua County (TW); Zhen-Min Wu, Hsinchu (TW); Shun-Chin Chang, Pingtun (TW); Yu-Chi Su, Hsinchu (TW)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/833,167

(22) Filed: Mar. 15, 2013

(65) Prior Publication Data

US 2013/0254727 A1 Sep. 26, 2013

Related U.S. Application Data

(60) Provisional application No. 61/614,048, filed on Mar. 22, 2012.

(51) Int. Cl.
*G06F 17/50* (2006.01)
(52) U.S. Cl.
USPC .......................................................... 716/102

(58) Field of Classification Search
USPC ................................................... 716/100–106
See application file for complete search history.

(56) References Cited

U.S. PATENT DOCUMENTS

| | | | |
|---|---|---|---|
| 8,601,419 B1 * | 12/2013 | Chiang et al. | 716/112 |
| 2003/0229862 A1 * | 12/2003 | Li et al. | 716/1 |
| 2008/0189667 A1 * | 8/2008 | Pikus et al. | 716/5 |

\* cited by examiner

*Primary Examiner* — Binh Tat
(74) *Attorney, Agent, or Firm* — Kilpatrick Townsend & Stockton LLP

(57) ABSTRACT

Systems, apparatus and methods for handling verification violations are disclosed. In one aspect, a method stores a list of fix information in addition to geometric shapes for each layer during verification, such as design rule checking For each primitive operation step performed during verification, two tasks are performed. First, if the primitive operation is a dimensional checking operation (i.e., width, spacing or enclosure), then for each violation, the first task creates fix information containing violation edge pairs and adds the created fix information to the fix information list on the output layer. Second, for all operations and after the output shapes on the output layer are generated, a second task passes the fix information on input layers which overlap any output shape of the output layer to the output layer's fix information list. Finally, fix guides for the final violation results are generated and drawn based on the final fix information list.

18 Claims, 13 Drawing Sheets

SYSTEM AND METHODS FOR HANDLING VERIFICATION ERRORS

CROSS-REFERENCES TO RELATED APPLICATIONS

This Application claims the benefit of and priority to U.S. Provisional Application No. 61/614,048, filed Mar. 22, 2012, and entitled "System and Method for Handling Verification Errors," the entire disclosure of which is herein incorporated by reference for all purposes.

FIELD OF THE INVENTION

The present disclosure relates to systems, apparatus and methods in the field of electronic design automation and, more particularly, for an improved apparatus, systems and methods of handling verification errors or violations, such as design rule check errors or violations.

BACKGROUND OF THE INVENTION

Electronic design automation (EDA) is a general term used to describe computer-based design tools that assist an engineer or designer in their design tasks. EDA tools are especially useful in the integrated circuit (IC) design field. The improvement of EDA tools for IC design work has enabled a corresponding increase in speed to market for electronic products and facilitated a greater level of sophisticated interoperability between systems used by disparate designers and manufacturers.

EDA tools often involve circuit schematic capture, design verification and circuit layout for IC circuit design in the analog, digital, mixed signal, and custom circuit devices fields. With the layout aspect of EDA work, IC designers continue to strive towards more efficient use of a device's physical space. Manual and automated layout tools within conventional EDA tools commonly assist IC designers in this manner. In doing so, the EDA tools rely upon design rules that provide working parameters for an acceptable design and that can be verified for a particular design.

As technology advances, the details and complexity of design rules are commonly known to increase at a rapid pace. IC layout typically follows semiconductor foundry design rules for a particular process that will implement the designed IC (e.g., a 65 nm process). Following such design rules helps to ensure the yield rate at manufacturing. When design rules are found to be in violation by a particular design, an EDA tool user typically uses one or more aspects or features of the EDA tool to fix or otherwise change the current design to remove the design rule violations. However, at times, this can be cumbersome and quite complicated as what may appear at first to be a desired fix for a detected DRC error or violation may actually introduce or induce other errors or violations. Additionally, some errors may be multi-faceted in that a given layout may violate several rules in several different ways. Thus, there is a need to easily detect and implement fixes to remove verification rule violations without causing or while minimizing new violations and to handle more complex verification rule violations.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

In accordance with aspects of the present invention, an improved system, apparatus and computer-implemented method is provided for handling verification violations. In one aspect, a method stores a list of fix information in addition to geometric shapes for each layer during verification, such as design rule checking. For each primitive operation step performed during verification, two tasks are performed. First, if the primitive operation is a dimensional checking operation (i.e., width, spacing or enclosure), then for each violation, the first task creates fix information containing violation edge pairs and adds the created fix information to the fix information list on the output layer. Second, for all operations and after the output shapes on the output layer are generated, a second task passes the fix information on input layers which overlap any output shape of the output layer to the output layer's fix information list. Finally, fix guides for the final violation results are generated and drawn based on the final fix information list.

In one embodiment, a method for handling violations during verification of a design configuration includes receiving, at one or more computer systems, information indicative of a first set of geometric shapes for each layer of the design configuration. Information is received indicative of a set of design rules, each design rule in the set of design rules indicative of a series of one or more primitive operations. A second set of geometry shapes is generated for a first layer of the design configuration. A list of fix information is generated for the first layer of the design configuration in response to a verification of the second set of geometry shapes for the first layer of the design configuration based on the set of design rules and a list of fix information for a second layer of the design configuration generating in response to a verification of a second set of geometry shapes for the second layer of the design configuration based on the set of design rules.

Generating the list of fix information for the first layer of the design configuration may include including fix information from the list of fix information for the second layer of the design configuration that overlaps one or more geometry shapes in the second set of geometry shapes for the first layer of the design configuration. Generating the list of fix information for the first layer of the design configuration may include pruning fix information from the list of fix information for the second layer of the design configuration that is irrelevant to the second set of geometry shapes for the first layer of the design configuration. Pruning fix information from the list of fix information for the second layer of the design configuration that is irrelevant to the second set of geometry shapes for the first layer of the design configuration may include propagating an input violation as an output violation when the input violation intersects with at least one geometry shape in an output set of geometry shapes.

Generating the list of fix information for the first layer of the design configuration may include determining one or more violations of the set of design rules in response to one or more primitive dimensional checking operations. At least one of the one or more primitive dimensional checking operations may include a minimum width operation, a minimum spacing operation, or a minimum enclosure operation. Generating the second set of geometry shapes for the first layer of the design configuration may include generating a set of output shapes on an output layer in response to one or more primitive geometrical operations. At least one of the one or more primitive geometrical operations include an AND operation specifying an intersection between a set of shapes on two layers, an OR operation specifying a merge between a set of shapes on two layers, a NOT operation specifying a subtraction between a set of shapes on two layers, a SIZING operation specifying a change in size of a set of shapes, or a SELECTION operation specifying a selection of a set of shapes.

In one aspect, one or more fix guides are generated based on the list of fix information for the first layer of the design configuration. Generating the one or more fix guides may include intelligently determining which fix guides to generate based on fix information in the list of fix information for the first layer of the design configuration that renders redundant at least one other fix information in the list of fix information for the first layer of the design configuration. A determination may be made whether first fix information in the list fix information for the first layer of the design configuration is superseded by second fix information in the list fix information for the first layer of the design configuration. Generating the one or more fix guides may include a fix guide for the second fix information and not the first fix information.

Determining whether the first fix information in the list fix information for the first layer of the design configuration is superseded by the second fix information in the list fix information for the first layer of the design configuration may include determining that the first fix information identifies a first design rule violation that occurs at the same location as a second design rule violation identified by the second fix information. A fix according to the second fix information to resolve the second design rule violation also resolves the first design rule violation.

Generating the one or more fix guides may include representing a design rule violation as a pair of edges in the second set of geometry shapes for the first layer of the design configuration. Generating the one or more fix guides may include generating information configured to display a set of directional arrows associated with a pair of edges in the second set of geometry shapes for the first layer of the design configuration, the set of directional arrows indicative of an dimensional amount that will resolve a design rule violation. Generating the one or more fix guides may include generating one or more fix guides for diagonal spacing violations. Generating the one or more fix guides for diagonal spacing violations may include determining a violation in a first component direction of a diagonal spacing violation and determining a violation in a second component direction of the diagonal spacing violation.

In another aspect, a fix guide is displayed corresponding to at least some of the fix information in the list of fix information for the first layer of the design configuration on a display device.

In some embodiments, receiving the information indicative of the first set of geometric shapes for each layer of the design configuration may include storing a plurality of geometric shapes for each layer of the design configuration in a database. Receiving the information indicative of the set of design rules may include receiving a rule deck. Generating the second set of geometry shapes for the first layer of the design configuration may include generating output geometry for an output layer. Generating the list of fix information for the first layer of the design configuration may include storing an overall list of fix information after verification. For each primitive operation set during verification: if the primitive operation step is a dimensional checking operation, generating fix information comprising violation edge pairs and adding the generated fix information for the layer to the overall fix information, and for each primitive operative step, generating the output shapes on the output layer and passing fix information on input layers which overlaps any output shape of the output layer to the overall list of fix information.

In one embodiment, a non-transitory computer-readable medium storing computer-executable code for handling violations during verification of a design configuration includes code for receiving information indicative of a first set of geometric shapes for each layer of the design configuration, code for receiving information indicative of a set of design rules, each design rule in the set of design rules indicative of a series of one or more primitive operations, code for generating a second set of geometry shapes for a first layer of the design configuration, and code for generating a list of fix information for the first layer of the design configuration in response to a verification of the second set of geometry shapes for the first layer of the design configuration based on the set of design rules and a list of fix information for a second layer of the design configuration generating in response to a verification of a second set of geometry shapes for the second layer of the design configuration based on the set of design rules.

In another embodiment, a system for handling violations during verification of a design configuration includes a processor and a memory configured to store a set of instructions which when executed by the processor configure the processor to receive information indicative of a first set of geometric shapes for each layer of the design configuration, receive information indicative of a set of design rules, each design rule in the set of design rules indicative of a series of one or more primitive operations, generate a second set of geometry shapes for a first layer of the design configuration, and generate a list of fix information for the first layer of the design configuration in response to a verification of the second set of geometry shapes for the first layer of the design configuration based on the set of design rules and a list of fix information for a second layer of the design configuration generating in response to a verification of a second set of geometry shapes for the second layer of the design configuration based on the set of design rules.

Additional advantages of this and other aspects of the invention will be set forth in part in the description which follows, and in part will be obvious from the description, or may be learned by practice of the invention. It is to be understood that both the foregoing general description and the following detailed description are exemplary and explanatory only and are not restrictive of the invention, as claimed.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

Figure 1:
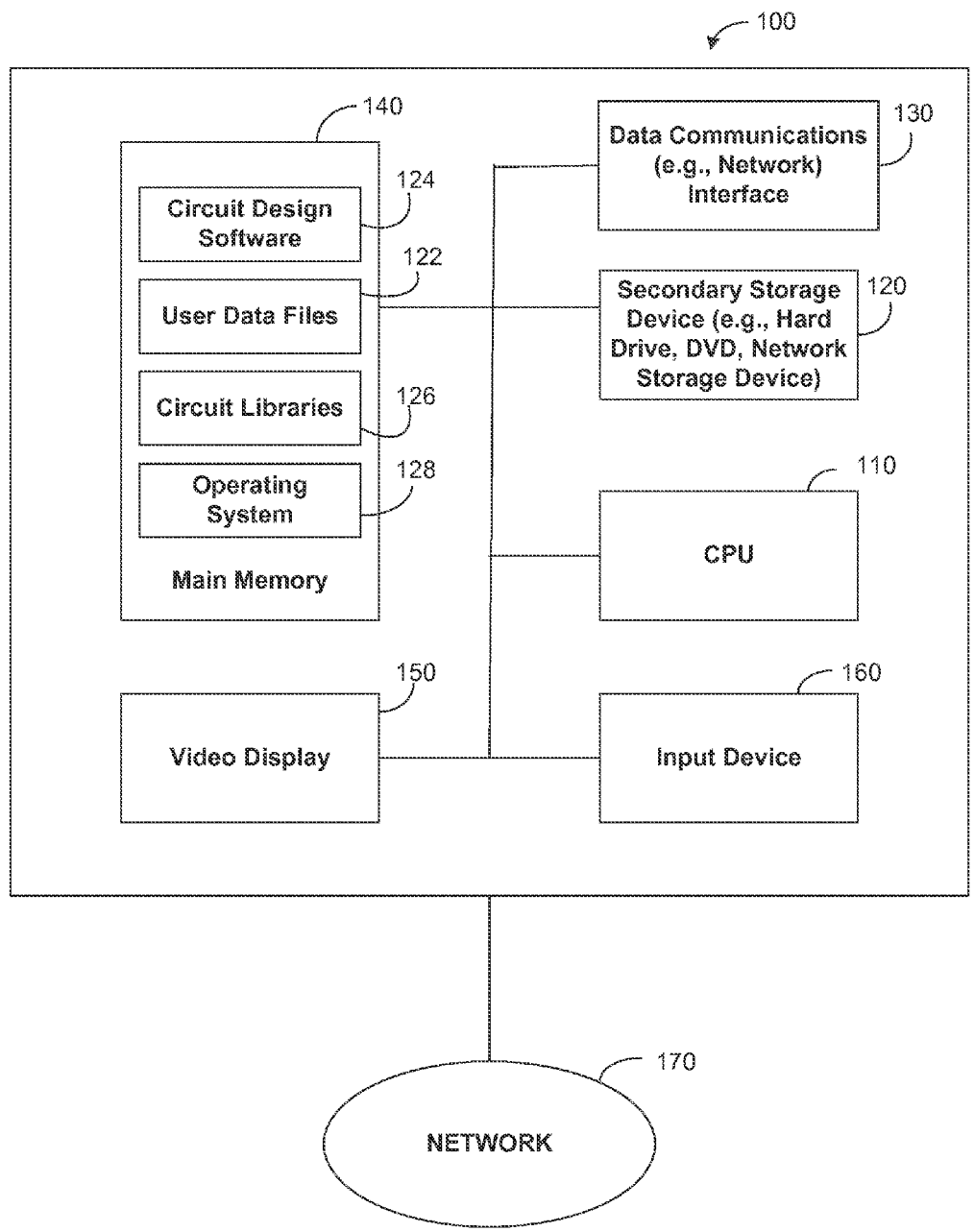
FIG. 1 is an exemplary computer-implemented operating environment for an embodiment of the present invention.

Reference will now be made in detail to exemplary embodiments. Wherever possible, the same reference numbers are used in the drawings and the description to refer to the same or like parts.

In general, embodiments of an improved system, apparatus and computer implemented method for handling verification violations are described herein. FIG. 1 is a general diagram of a computer system on which software modules and applications shown in FIG. 2 may execute in one or more embodiments of the present invention. A general description of verification, such as the tasks and rules involved with design rule checking, then follows to provide a framework for a description of various embodiments of the invention. The remaining Figures illustrate and support the description of various embodiments of how an EDA system may handle verification error(s) and present improved guides for fixing at least a portion of a design (e.g., layout, etc.) that may be in violation of a set of verification standards, such as a set of design rules for a particular foundry process. Such improved guides help to interactively and productively address the verification violations while not causing or minimizing additional verification violations in accordance with principles of the present invention.

Hardware Environment

Referring first to FIG. 1, an exemplary computer-implemented operating environment is illustrated that is suitable for practicing methods and implementing an apparatus and systems consistent with principles and aspects of the present invention. Computer system 100 of FIG. 1 is shown connected to a network 170, such as a Local Area Network, Wide Area Network, or the Internet. Computer system 100 contains a central processing unit (CPU) 110, a memory storage device called main memory 140 (e.g., RAM, ROM, or a combination of both), a secondary memory storage device 120, an input device 160 (e.g., a keyboard, mouse, tablet, touch pad interface, etc.), and a video display 150, each of which are electronically coupled to the other parts of computer system 100. Computer system 100 also includes a data communications interface 130, which is also electronically coupled to the other parts of the computer system 100 and facilitates data communications with network 170 and other computer systems (not shown) or network storage devices (not shown).

In an exemplary embodiment consistent with the present invention, computer system 100 may be implemented as a single general purpose computer. However, those skilled in the art will appreciate that computer system 100 may also be implemented in a client/server configuration, a cloud computing configuration, or other multi-processor or massively parallel computing implementations that take advantage of alternative hardware and network architectures useful for EDA use.

Within computer system 100, main memory 140 contains an operating system 128, applications (such as circuit design software 124 having verification modules (e.g., design rule check modules)), software libraries (such as circuit libraries 126), and user data files (such as files 122 created using circuit design software 124 to represent a particular circuit or groups of circuits). Embodiments of the present invention may be implemented as computer software (such as applications, software libraries or user files) residing on computer-readable media, which when read and executed by a conventional computer, causes the computer to function as part of a system, such as an IC design and layout system, executing an improved method in accordance with the invention for handling verification violations. Suitable computer-readable media includes, but is not limited to, main memory 140 or secondary storage memory 120 (e.g., hard drives, compact disks, floppy disks, magneto-optical disks, DVD media, network storage drives, flash memory device and other electronic articles having computer memory).

Software Environment

Figure 2:
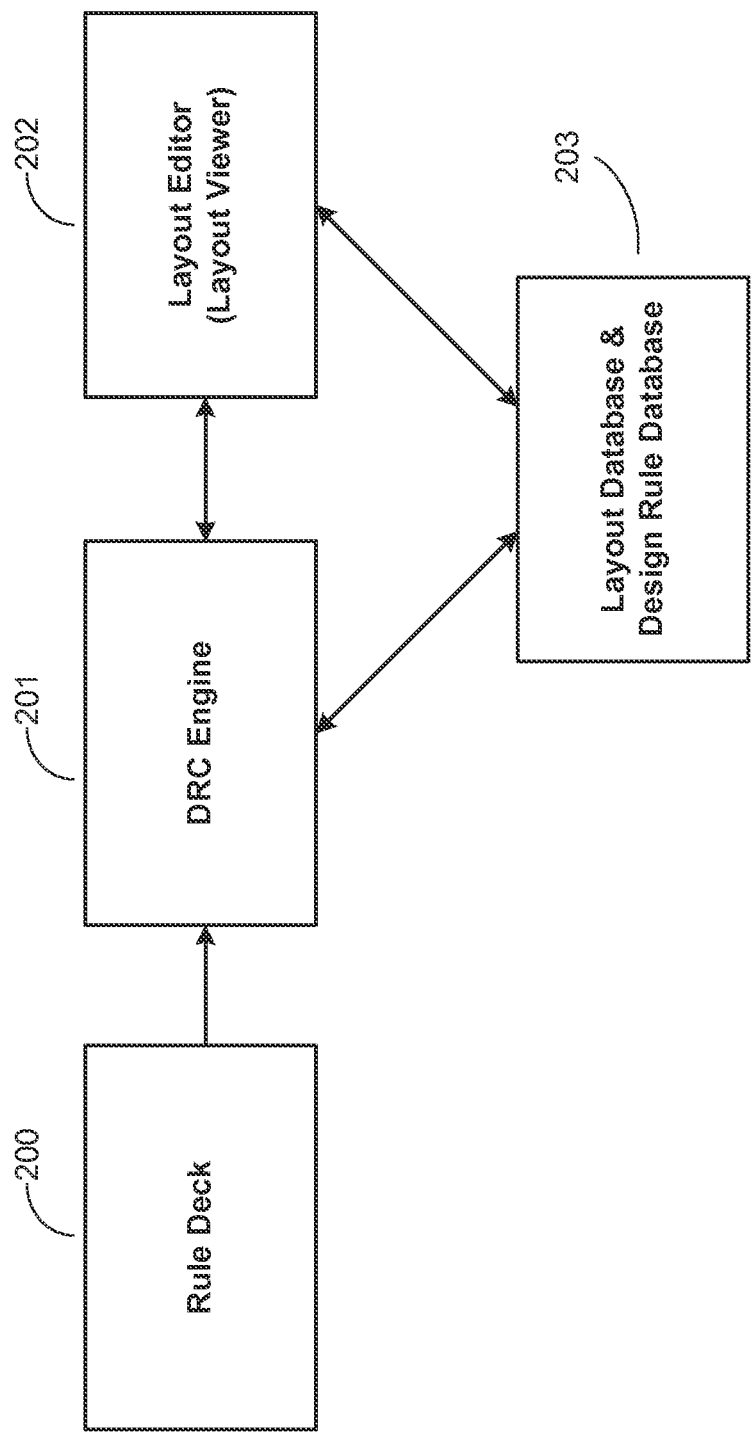
FIG. 2 is an exemplary device creation flow diagram in accordance with an embodiment of the present invention.

In the context of such an exemplary computer system, FIG. 2 illustrates an exemplary diagram in terms of software modules within circuit design software 124/circuit libraries 128 that may be used in accordance with an embodiment of the present invention. As generally shown in FIG. 2, these software modules (which may include, for example, data sets) include a Rule Deck 200, a DRC Engine 201, a Layout Editor (or Layout Viewer) 202, and a Layout Database & Design Rule Database 203. One skilled in the art will appreciate that DRC Engine 201 may be implemented as a standalone program or embedded in a layout editor, such as Layout Editor 202.

In operation, the embodiment illustrated in FIG. 2 has the DRC Engine 201 interacting with the other modules as it performs verification operations and handles verification violations. For example, DRC Engine 201 reads the Rule Deck 200 and Layout Database & Design Rule Database 203 to gather input, performs checking on the input layouts, generates resulting reports and writes back to the database. The Rule Deck 200 may be submitted to the DRC Engine 201 directly by the user or indirectly through the Layout Editor 203. After the reports are written to the database, the Layout Editor (or Layout Viewer) 202 can display on top of layouts on the screen. Hints, or "fix guides", may also be shown by the Layout Editor (or Layout Viewer) 202 to interactively and efficiently help the user correct DRC violations.

In the context of the above-referenced computer hardware (FIG. 1) and software operating environment (FIG. 2), several examples will be described as follows in accordance with embodiments and principles of the present invention. Generally, verification of an IC design is an important part of the IC design process that may use the FIG. 1 hardware and FIG. 2 software. Those skilled in the art will appreciate that verification is a general term associated with one or more tasks performed with EDA tools that ensure some or all of the IC design is compliant with one or more rules. Verification can take the form of design rule checking (DRC), where the physical layout of an IC design is checked against a set of parameters commonly referred to as design rules. Those skilled in the art will appreciate that principles of the present invention may be applicable to embodiments of verification tasks beyond or in addition to DRC.

Verification Rules

Verification rules, such as design rules, may be simple for some EDA systems and process standards. However, the verification rules may become quite restrictive, complex, and multi-faceted for more complex designs using more advances semiconductor processing.

For example, IC design rules for process nodes larger than 65 nm are relatively simple and straight forward, such as "minimum width", "minimum spacing", or "minimum enclosure" rules, etc. A particular design rule may include, for example, rule "m1.s1" that states: "the minimum width for any geometry on metal-1 layer is 1 micron." In this simple example, when a DRC software module checks for a rule m1.s1 violation, it may look for any pair of facing edges of a geometry in the IC layout that are separated by less than 1 micron. When one is found, the software can report the locations of the two edges and how much the geometry should be expanded along that direction to clear that violation. This information can be used to display a simple "fix guide" on the screen to help the EDA tool user fix that violation.

In a more sophisticated example, such as a design implemented with a 65 nm process node or smaller, many design rules may be contingent upon multiple conditions, such as size of current geometry, relative locations of neighboring geometries, etc. This often poses challenges different than those faced in more simplistic and larger processing geometries. For example, at 65 nm or smaller, a layer may have a "line end" rule that says: "the minimum spacing for end of a first geometry to a second geometry on the same layer is S if the first geometry width is less than W and there is a third geometry that runs in parallel to the first geometry within a distance of P." When there is a violation of "line end" rule, it may appear that there are three possible ways to fix it: enlarge end-of-line spacing to S, enlarge width to W, or enlarge parallel spacing to P. Accordingly, there remains a need in such a sophisticated example of collecting these possible fixes systematically and without having to consider the specific meaning of each and every advanced rule.

Rule Sets

Design rule checking is typically performed by a software module as part of an EDA tool as a series of "primitive" operations. In one embodiment, the input to a primitive operation may be a set of geometric shapes on a certain layer or multiple layers, and the output may typically be a new set of geometric shapes on another layer called a "derived" layer. The primitive operation may act on the input (e.g., shapes) by, for example, performing a geometrical operation on the input shapes. In another example, the primitive operation may act on the input by performing a dimensional check on the input shapes.

In one embodiment, geometrical operations may include, but are not limited to, "AND" (an operation that generates an intersection of shapes on two layers), "OR" (an operation that merges shapes on two layers), "NOT" (an operation that generates the remainder of shapes on first layer that do not intersect any shape on second layer), "sizing" (an operation that enlarges or shrinks the input shapes by a certain factor), and "selection" (an operation that prunes shapes that do not satisfy certain conditions). In another embodiment, dimensional checking may include, but is not limited to, tasks or operations that check "minimum width", "minimum spacing", "minimum enclosure", etc., of the input shapes.

In general, each foundry design rule is typically broken down to a series of primitive DRC operations that are to be computed by the DRC software. The set of primitive DRC operations for a foundry design rule may be referred to as a "rule set". An exemplary rule set typically includes geometrical operations and dimensional checking operations. However, those skilled in the art will appreciate that other examples of rule sets may include only geometrical operations or only dimensional checking operations. Additionally, a rule set may include some other type of operation that tests or checks the input shapes against an identifiable threshold parameter, such that a primitive operation may be performed to determine whether the input shape meet or exceed the identifiable threshold parameter as part of verification.

In one embodiment, dimensional checking may be done as part of DRC operations on a "finding the bad guy" basis. For example, when width checking, a primitive operation may essentially say: "find any shape in the input whose width is smaller than X, and output it to layer Y." If the result is empty, then the input portion of the design check passes that particular check.

In one embodiment, the last operation in a rule set may be a dimensional checking operation. Any shape resulting from that checking operation is deemed a violation of the foundry rule checked by that particular rule set. Resulting shapes from the last step are used to report DRC violations of that foundry rule. They can be used as error markers to show on top of the IC layout on the screen.

Verification Results

The results of verification may be presented in a variety of forms. In one embodiment, a verification violation may be presented as an error marker and/or a simple displayed guide to fix a specific error (referred to herein as a "fix guide"). In general, an error marker is considered to be a shape resulting from the last checking operation in a rule set and can be used to report to the user or otherwise identify where the violations are located relative to the checked portion of the IC design. For example, an error marker may identify the amount of distance needed to apply for the fix as the difference between the dimension of a resulting shape and the checking condition. However, in general, a conventional fix guide is not known to handle "complex design rules" and is not known to address multiple ways to address the violation, or how to do so intelligently and systematically, while not causing further violations.

In light of this background information on verification and design rule checking, one skilled in the art will appreciate that disclosed herein are several different embodiments according to principles of the present invention that may advantageously address one or more of these problems. Generally, one aspect of an embodiment allows and facilitates collection, trimming and propagating of verification violations for each operation in a rule set. In other words, an embodiment may generate output violations intelligently so as to handle more complex and robust design rules and minimize further violations with what is presented as ways to address the violations.

In one embodiment, an exemplary modified primitive operation involves additional information beyond the set of geometric shapes. For example, the modified primitive operation used when verifying (e.g., design rule checking) may be characterized as follows:

TABLE 1

| | |
|---|---|
| INPUT | A set of geometry shapes on certain layer plus the fix information of violations, or multiple sets of them. |
| OPERATION | Geometric operators (e.g., AND, OR, NOT, sizing) or conditional selections, or Checking operations (e.g., "width", "spacing" or "enclosure"). |
| OUTPUT | Set of geometry shapes on the output layer plus the fix information of violations. |

A violation of the exemplary modified primitive operation may be expressed as a pair of edges. In order to generate output violations intelligently, the embodiment may perform additional operations. For example, a "Trim" operation may propagate an input violation to output only if it intersects or touches at least a geometric shape in the output. Otherwise, discard it. Also, an "Add" operation for checking operations (e.g., width, spacing or enclosure) adds new violations to the output.

In another embodiment, an exemplary rule set for a "line end" design rule may be expressed as follows:

Metal1 shapes with width<W, output to layer 1001
   Layer 1001 shapes having a parallel run spacing<P with Metal1, output to layer 1002
   Layer 1002 shapes having a line end spacing<S with Metal1, output to layer 1003

For the different layers, different verification outputs will result that may include the fix information of related violations per such additional operations. For example, for layer 1001, the additional operation would add metal1 shapes with width<W, plus fix information for width violations. Likewise, for layer 1002, the additional operation would add layer 1001 shapes with parallel run spacing<P with metal1, plus fix information for width and parallel run spacing violations. And similarly, for layer 1003, the additional operation would add layer 1002 shapes with line end spacing<S with metal1, plus fix information for width, parallel run and line-end spacing violations.

With the additional operations performed, the embodiment for this exemplary "line end" design rule check would then report any shape in layer 1003 as "line end" error. Each shape in layer 1003 should have three edge pairs of fix information intersecting or touching it—namely, one violation originated from layer 1001, one from 1002 and one from 1003. These three violations serve the basis of the fix guide for the line-end DRC error.

Displayed Fix Guides

Figure 3:
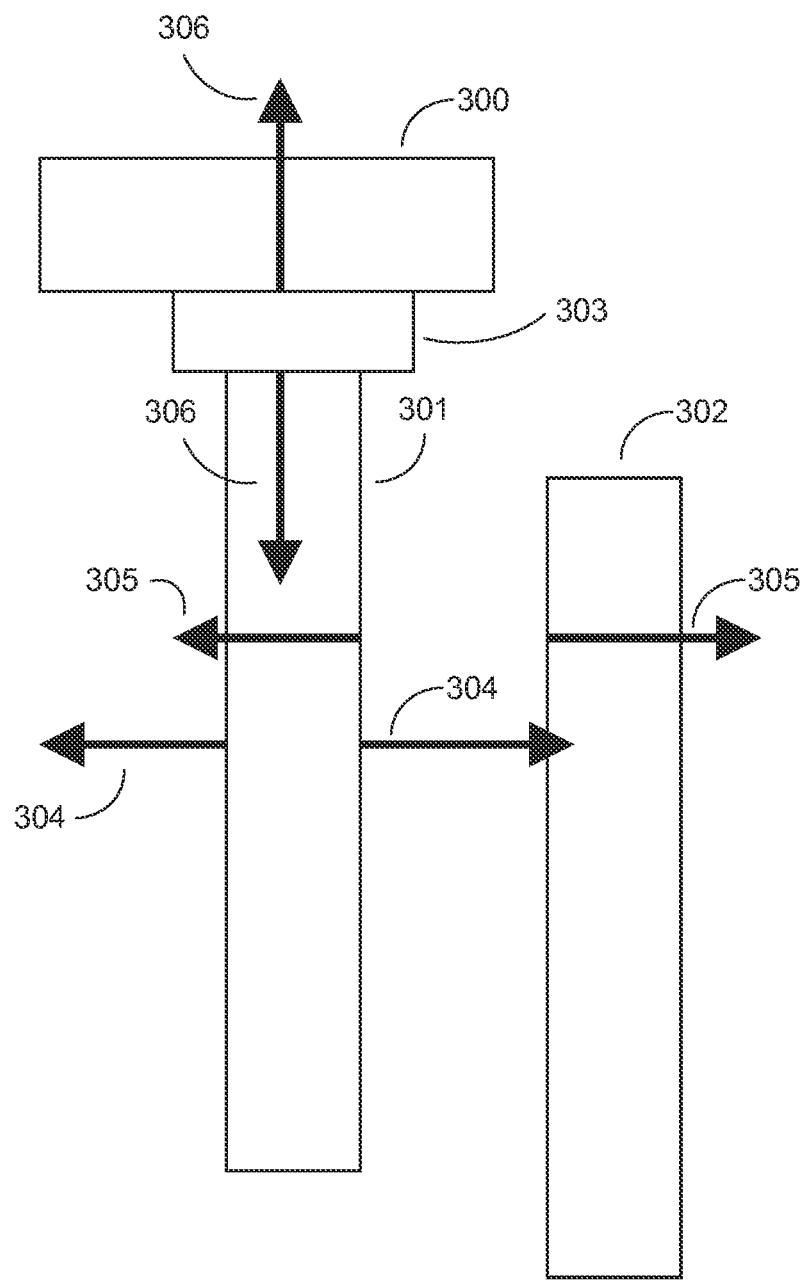
FIG. 3 is a layout diagram of an exemplary circuit with fix guide information displayed associated with verification violations in accordance with an embodiment of the present invention.

In this embodiment using such a modified primitive for the line-end DRC operation, the resulting three fix guides and the line-end design rule violation may be displayed as shown in FIG. 3. Referring now to FIG. 3, three circuit elements 300-302 are illustrated in an exemplary layout configuration. After running a DRC on these elements, three exemplary fix guides 304-306 may be displayed that are associated with different ways to fix the DRC violations, respectively, along with a verification violation box 303. The length of each arrow segment in fix guides 304-306 indicates the amount of displacement needed in that direction to address the noted design rule errors. In more detail, the line metal of element 301 has width<W. The length of the two fix guide arrows 304 associated with element 301 indicates that if the line metal of element 301 is widened by that amount in either direction as arrows 305 show, the width of element 301 will become greater than or equal to W, and therefore the design rule violation will be cleared. Second, element 301 has a parallel run neighboring element 302 with spacing<P. The length of the two fix guide arrows 305 show that if element 301 or element 302 is pushed by that amount in either direction as arrows 305 show, spacing between element 301 and element 302 will become greater than or equal to P, and therefore the design rule violation will be cleared. Lastly, element 301 and 300 show a line-end spacing violation in that its line-end spacing should be greater than or equal to S, or it is a DRC error. As shown, the line-end spacing between elements 300 and element 301 is<S. The length of the two fix guide arrows 306 indicates that if element 300 or element 301 is pushed by that amount in either direction as arrows 306 show, spacing between element 300 and element 301 will become greater than or equal to S, and therefore the design rule violation will be cleared. To fix the line-end design rule violation, the user may take corrective action by enlarging either of the two spaces, or widening the wire. As soon as one of the three is done, all the three guides and the DRC error marker will disappear.

Figure 4:
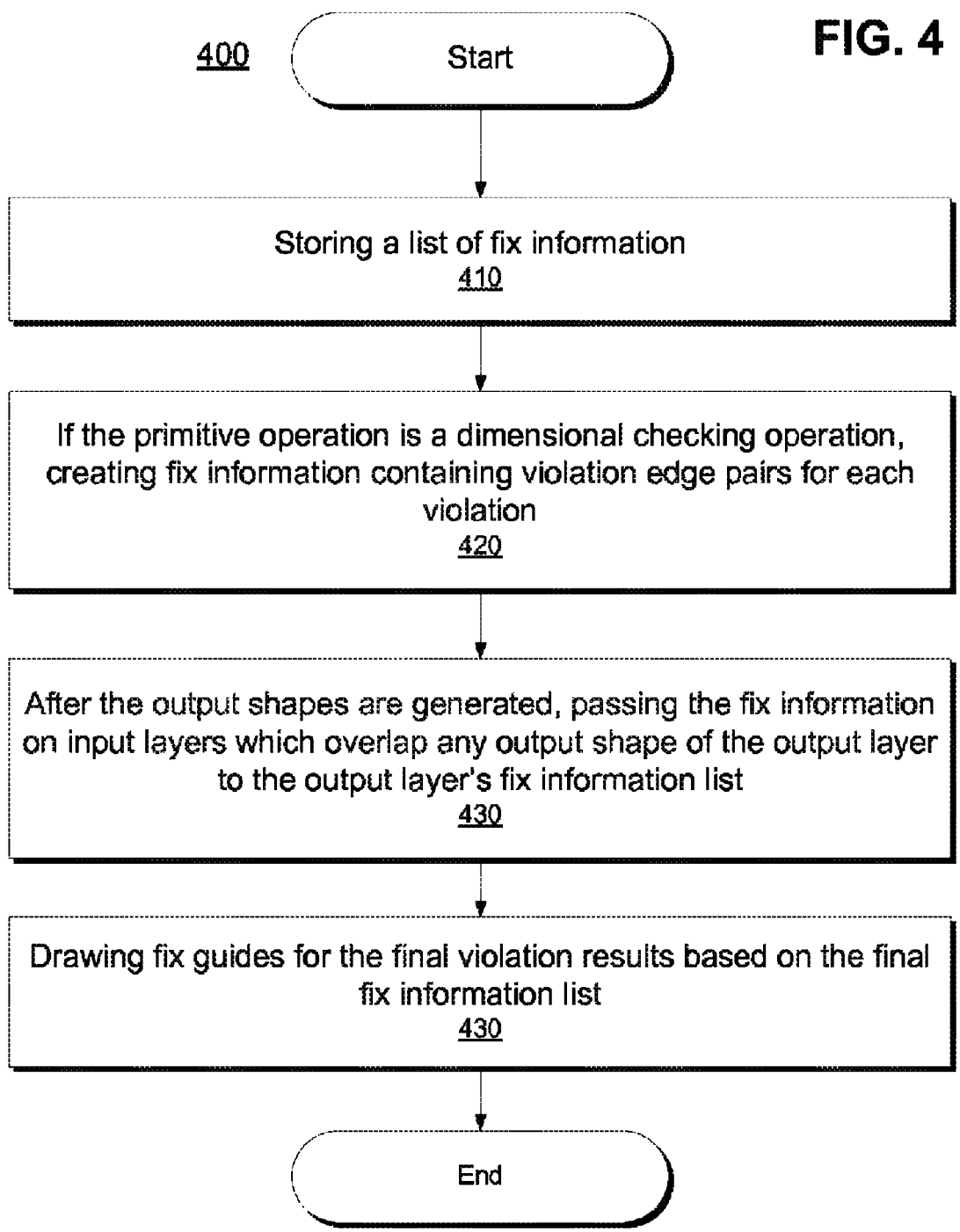
FIG. 4 is a flow chart diagram for an example method of handling verification violations in accordance with an embodiment of the present invention.

Thus, in one embodiment and in light of the prior modified primitive description, an improved method for handling verification violations and presenting fix guides for the final violation results is described with reference to FIG. 4. Referring now to FIG. 4, the method 500 generally begins at step 410 by storing a list of fix information in addition to geometric shapes for each layer during verification, such as design rule checking For steps 420 and 430, at each primitive operation step performed during verification, two tasks are performed. First, in step 420, if the primitive operation is a dimensional checking operation (i.e., width, spacing or enclosure), then for each violation, the first task creates fix information containing violation edge pairs and adds the created fix information to the fix information list on the output layer. Second, in step 430, for all operations and after the output shapes on the output layer are generated, a second task passes the fix information on input layers which overlap any output shape of the output layer to the output layer's fix information list. Finally, the method 400 finished in step 440 by drawing fix guides for the final violation results based on the final fix information list.

Fix Guides for Diagonal Spacing

Figure 5:
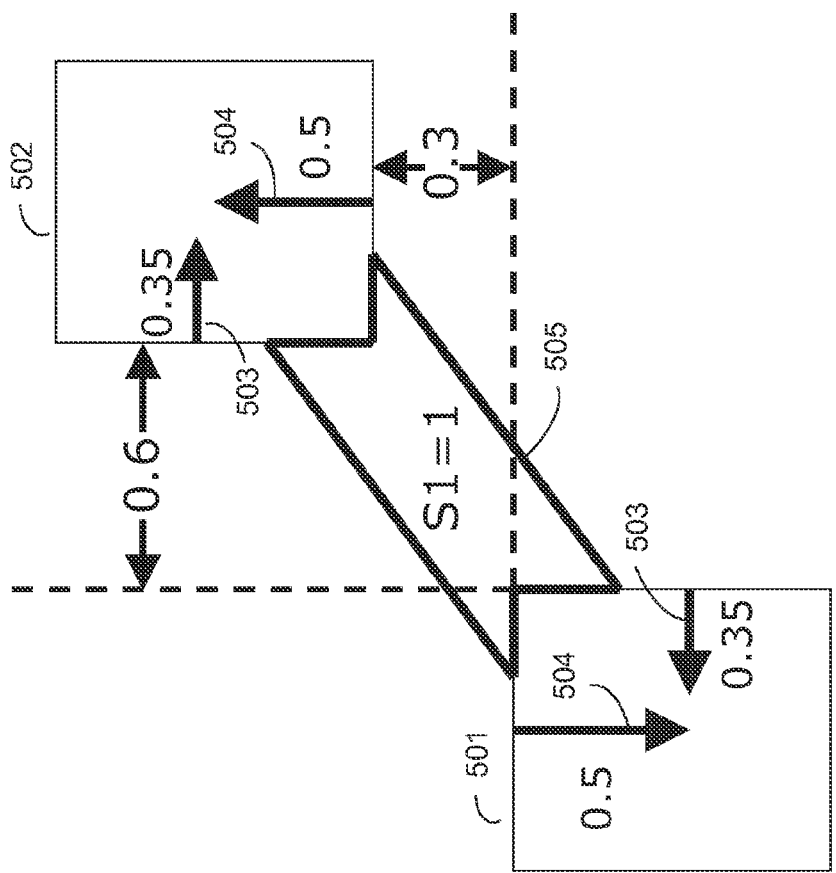
FIG. 5 is a layout diagram of an exemplary configuration of diagonal circuit elements with fix guide information displayed associated with verification violations in accordance with an embodiment of the present invention.

Violations for spacing may occur for horizontal spacing or vertical spacing, as shown in FIG. 3. However, principles of the present invention are equally applicable to embodiments where one or more violations occur between diagonal objects (i.e., objects that have no direct vertical and horizontal projections). FIG. 5 is a layout diagram of exemplary diagonal circuit elements with fix guide information displayed associated with one or more verification violations. Referring now to FIG. 5, exemplary diagonal circuit elements 501, 502 are displayed in a layout where the two circuit elements are in a diagonal relationship to each other. As shown, neither element 501 nor element 502 have direct vertical or horizontal projections. However, some design rules may govern the layout and placement of such diagonal elements. For example, in this embodiment a design rule S1 (illustrated as 505) represents that the diagonal spacing between elements must be equal to or greater than 1. Upon running a DRC verification operation, it is apparent that the original spacing of elements 501, 502 as shown (sqrt(0.3^2+0.6^2)=0.67, which violates design rule S1.

In this example, the fix guides drawn and displayed from the final fix information list will indicate two possible fixes. Fix Guide A is expressed as sqrt(1^2−0.6^2)−0.3=0.8−0.3=0.5 (illustrated with arrows 504). Alternatively, Fix Guide B is expressed as sqrt(1^2−0.3^2)−0.6=0.95−0.6=0.35 (illustrated with arrows 503).

Interactive Fix Scheme

Figure 6:
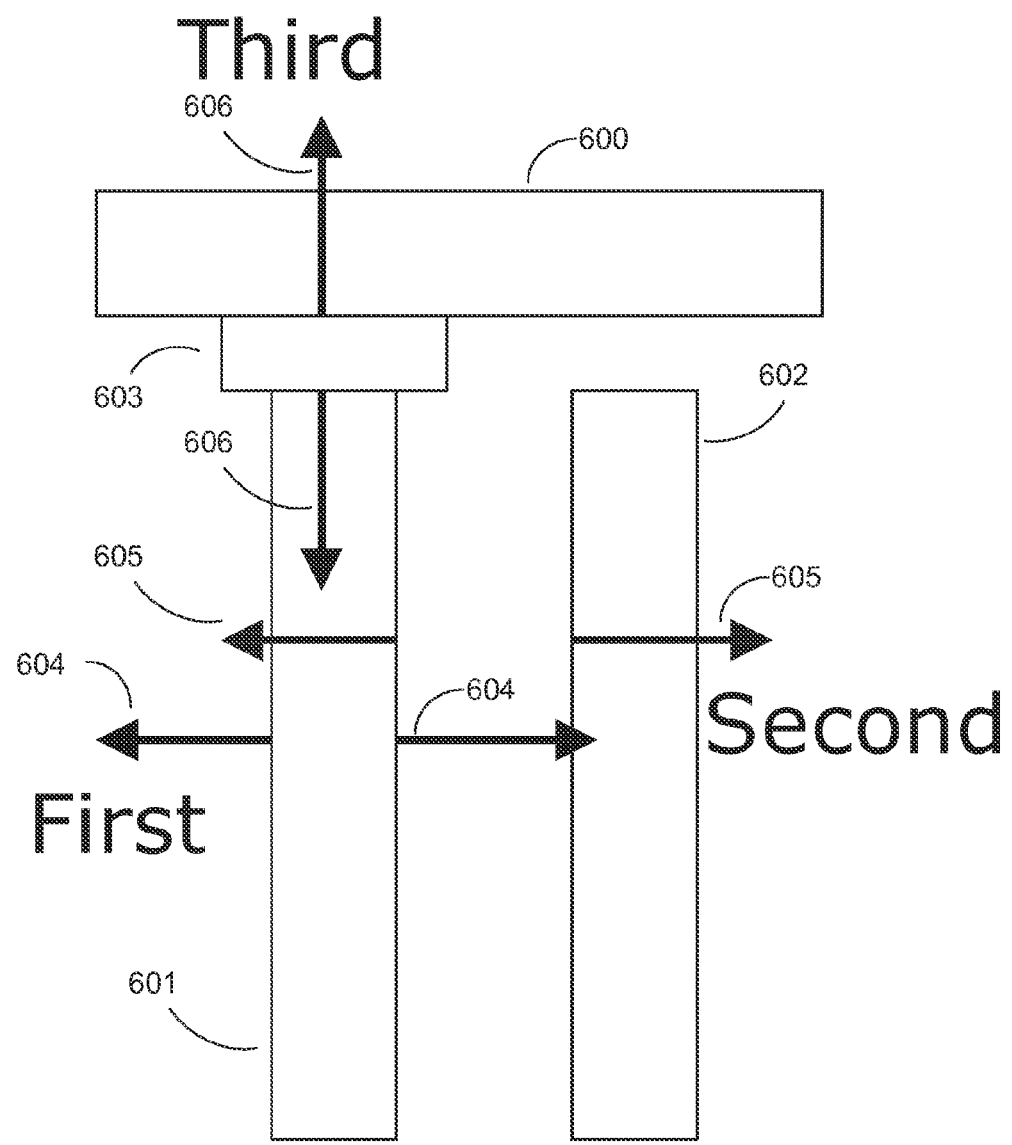
FIG. 6 is a layout diagram of another exemplary circuit with fix guide information displayed associated with verification violations in accordance with an embodiment of the present invention.

In an embodiment, the DRC Engine may not need to know what is a line-end rule and how to implement it. Instead, the exemplary DRC engine in the embodiment handles design rules in a more abstract and powerful manner. For example, when the rule designer finishes writing the low-level operations for DRC checking, the exemplary DRC engine automatically collects, propagates and prunes fix information from the operation set, and shows multiple pairs of fix guide markers for a violation. As shown in FIG. 6, such a violation is shown as box 603 with the fix guide markers shown as 304-306.

With this type of display presented to the user, an embodiment presents several options as part of the improved fix guide to address the detected verification violations. FIG. 6 illustrates a display of exemplary circuit elements showing detected verification violations in accordance with principles of an embodiment of the invention. First, for line metal width, if the user enlarges the width of element 601 to W, the violation box 603 will go away. Secondly, for the parallel run neighbor spacing between elements 601 and 602, if the user moves second element 602 to keep a distance of P from the line metal of first element 601, the violation box 603 will go away. Thirdly, for the line-end part, if the user stretches the line end of the first element 601 to keep it away from the top metal element 600 with distance S, the violation box 603 will go away.

Figure 7B:
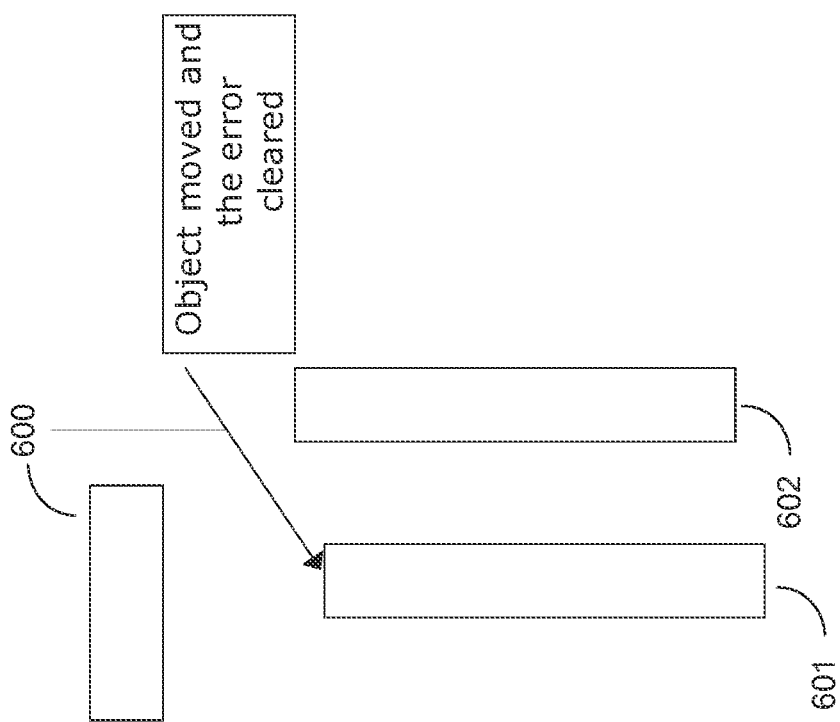
FIGS. 7A and 7B are layout diagrams of an exemplary circuit with fix guide information displayed associated with verification violations before and after the violation is cleared in accordance with an embodiment of the present invention.
Figure 7A:
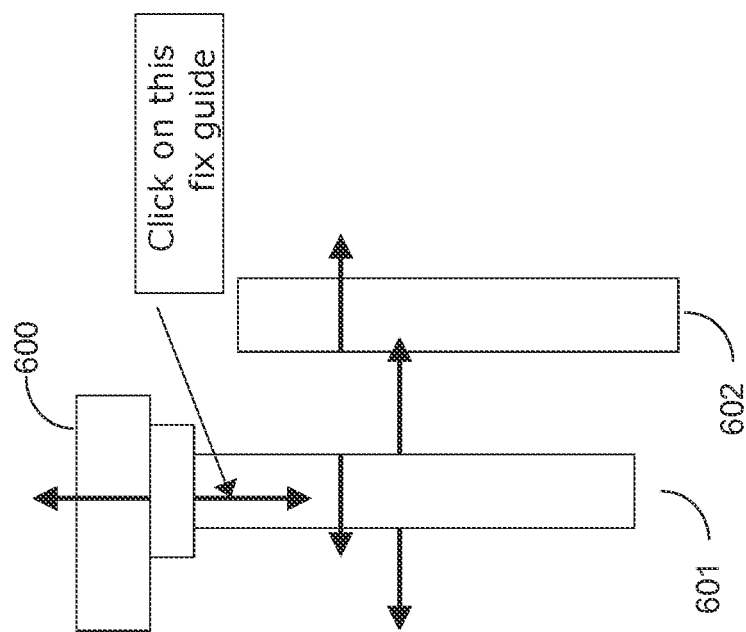

In another embodiment, an auto-fixing feature is explained. FIGS. 7A and 7B shows three exemplary circuit elements as disposed and presented with fix guides and after an auto-fix has been activated in accordance with an embodiment of the invention. As shown in FIG. 7A, three fix guide arrow markers are shown that indicate different verification violations. If the user clicks on one fix guide arrow marker, the embodiment automatically moves the geometry shape to a new location to clear that DRC error in connection with the particular fix guide arrow marker, as shown in FIG. 7B.

Figure 8B:
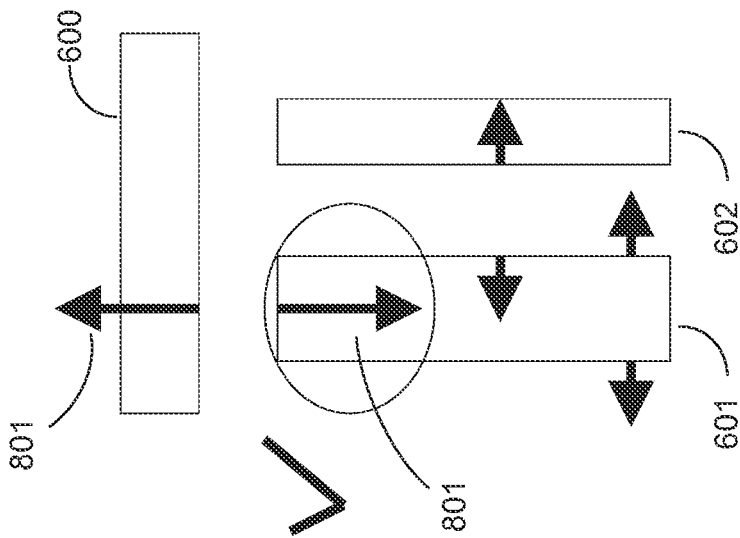
FIGS. 8A and 8B are layout diagrams of an exemplary circuit with fix guide information displayed associated with verification violations before and after consolidation and pruning of fix guide information and markers in accordance with an embodiment of the present invention.
Figure 8A:
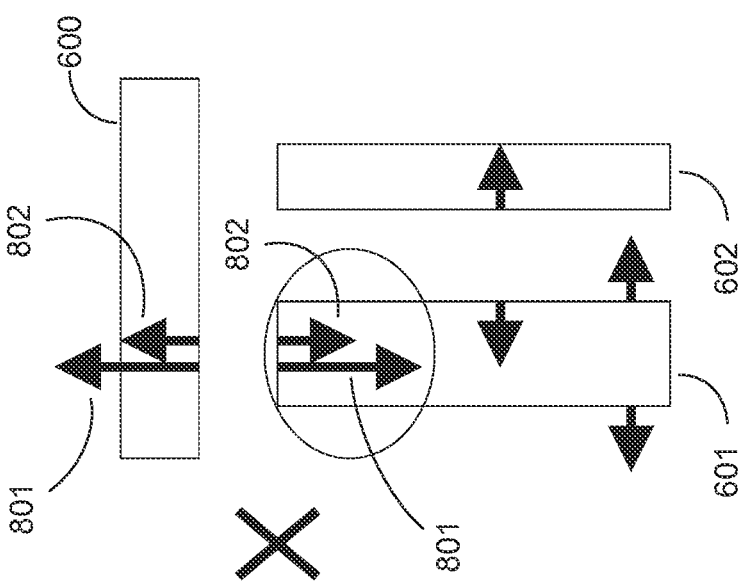

When two fix guides coincide but differ in amounts for displacement, an embodiment may only display the one with larger amount. For example, as shown in FIGS. 8A and 8B, circuit elements 600-602 are in a configuration where a verification operation has detected several errors or violations. One of the fix guides displayed 801 may relate to one particular design rule and require movement of the affected circuit elements by a larger amount than the amount indicated by another fix guide 802 associated with a violation of another design rule. Thus, the DRC Engine in this embodiment advantageously and intelligently presents only fix guide arrows 801, as shown in FIG. 8B.

The ability to extract different fix information to intelligently process and present more informed and improved fix guide solutions is a desired feature in an embodiment. In other words, from low-level operations (i.e., primitive operations), embodiments of the present invention may extract the possible fix information without knowing the high level rules (e.g., foundry rules). As such, an embodiment of the exemplary DRC Engine that runs the verification operation (e.g., design rules), need not know the overall high level rules. Instead, in this embodiment, the high level rules can be implemented with many low-level operations. The engine in the embodiment can extract the fix information according to the low-level operation sets if the operation sets have at least one dimensional operation (e.g., space, width or enclosure).

Figure 9B:
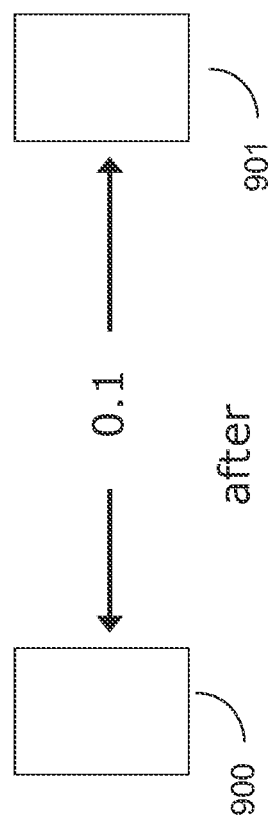
FIGS. 9A and 9B are layout diagrams of another exemplary circuit before and after the violation is cleared in accordance with an embodiment of the present invention.
Figure 9A:
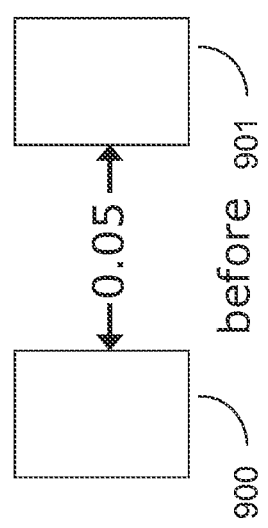

A common type of design rule used in verification is a minimum spacing rule. In general, a minimum spacing rule operates to constrain two or more different layout polygons (representing circuit elements) to keep a proper respective distance larger than or equal to a predetermined minimum spacing. As shown in FIG. 9A, circuit elements are shown as polygons 900 and 901 and are disposed with a spacing of 0.05 between the respective elements. In an embodiment, if a design rule exists where the minimum spacing=0.1 (see, e.g., the spacing shown in FIG. 9B), the exemplary layout of elements in FIG. 9A violates the design rule and there is a need for the user to fix the layer.

Figure 10:
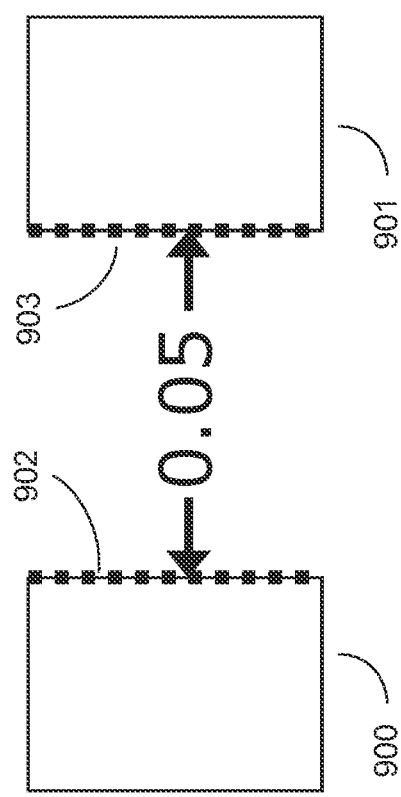
FIG. 10 is a layout diagram of another exemplary circuit illustrating exemplary reference points for spacing design rules in accordance with an embodiment of the present invention.

In one embodiment, a dimension DRC is edge-based with respect to spacing measurements. For example, as shown in FIG. 10, elements 900 and 901 are disposed in a layout where opposed edges 902 and 903 on the respective elements are illustrated with dotted edges. As such, the actual distance between edges 902 and 903 is 0.05, which is a violation for the edge pair because the minimum required spacing distance per the exemplary design rule is 0.1. In the embodiment, the system stores fix information related to this violation, such as information on the violating edge pair, the actual distance between the edges, and the needed distance.

Figure 11:
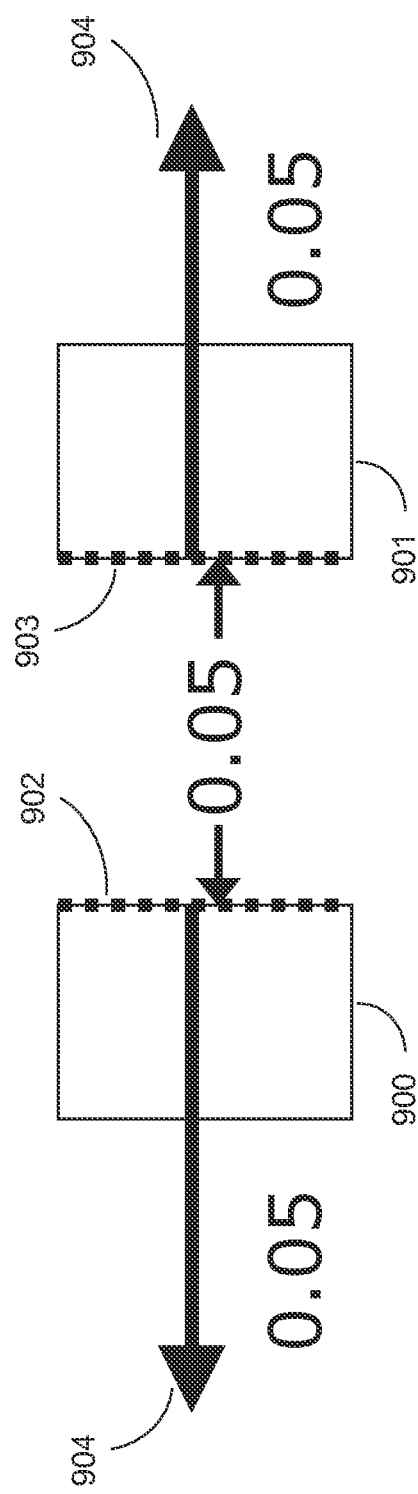
FIG. 11 is a layout diagram of the exemplary circuit of FIG. 10 with fix guide information displayed associated with verification violations in accordance with an embodiment of the present invention.

The module that processes the verification error, e.g., the DRC Engine module, processes the fix information related to this violation in order to show a fixing guide marker. In this example embodiment, for the dimension type of design rules (like minimum spacing rules), the module uses the fix information to determine the actual distance (0.05), compare it with needed distance (0.1), and then determine a fixing distance (0.1−0.05=0.05). As shown in FIG. 11, elements 900 and 901 are illustrated in an exemplary configuration where the determined fixing distance is 0.05. As such, the module shows a guide marker 904 to guide the user to either move element 900 to the left by 0.05 or move the right shape with the right dotted line to right by 0.05 for fixing this violation.

Passing Fix Information Through Derived Layers

In an embodiment of the invention, the verification module (e.g., the DRC Engine) can pass information related to the verification violation or error, such as the fix information on a violation, through derived layers without losing them. For example, in one embodiment there are four operations in an exemplary rule where two of the operations are dimensional types. Specifically the exemplary rule set is defined as follows:

Op1. LayerB::=LayerA with width<0.5
Op2. LayerC::=LayerB with space<1.0
Op3. LayerE::=LayerC which is not inside of LayerD
Op4. Output LayerE as the final violation results In this embodiment, although only Op1 and Op2 can create fixing information because they are dimensional operations, the embodiment may pass possible (i.e. pruned) fixing information from Layer B to C to E to show fixing guides for the final output violation results. Thus, an embodiment may gather, accumulate and further aggregate final output violation results in an intelligent manner.

Figure 12:
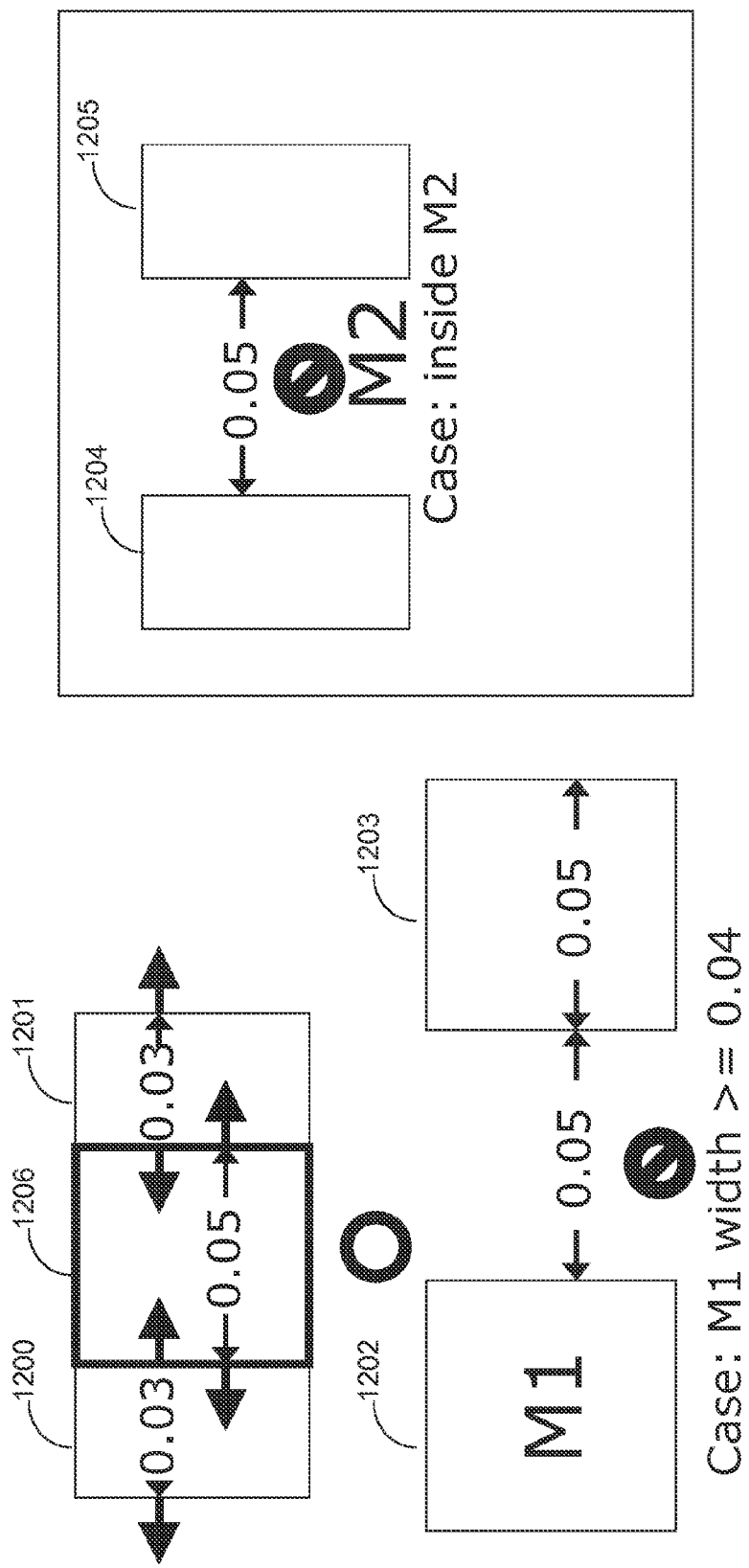
FIG. 12 is a layout diagram of yet another exemplary circuit with fix guide information displayed associated with verification violations in accordance with an embodiment of the present invention.

FIG. 12 illustrates another example embodiment where information related to the verification violation or error, such as the fix information on a violation, is massed through layers through derived layers and pruned fix information is further explained. As shown in FIG. 12, the embodiment illustrated shows several objects or elements are displayed after a verification operation, such as a DRC check. Elements 1200 and 1201 are shown in proximity to each other and spaced 0.05 apart with each element being 0.03 wide. Elements 1202 and 1203, also shown in proximity to each other, are spaced 0.05 apart, are each 0.05 wide, and are collectively referred to as the M1 elements for purposes of this example. And elements 1204 and 1205, also shown in proximity to each other, are spaced 0.05 apart and collectively referred to as the M2 elements for purposes of this example.

In this example, a general statement or expression of a design rule to be applied is that the M1 objects with width<0.04 should have spacing>=0.06, but do not consider the violations covered by M2. In more detail, the exemplary implementation of this design rule in this embodiment is as follows:

LayerA=M1 with width<0.04
LayerS=LayerA with space<0.06 as polygon
LayerC=LayerB which is not inside M2
Output LayerC as the final violation results Upon running the verification operation in this embodiment, the final violation results only show possible (may be multiple) guide markers for the violation (i.e., the box 1206).

In another embodiment of a method for storing a list of fixing information related to verification errors, various information is stored at each layer operation step before drawing the fixing guide for the final violation results. Specifically, in this method, at every layer operation step, two tasks are performed. First, if the layer operation is a dimensional type operation, the method creates fixing information with violation edge pairs and stores them to the fixing information list of the output derived layer. Second, for all of the layer operations, after the output derived layer is generated, the method passes the fixing information in input layers which overlap the shapes of the output derived layer into its fixing information list. Thereafter, as previously noted, the method draws the fixing guide for the final violation results.

Figure 13:
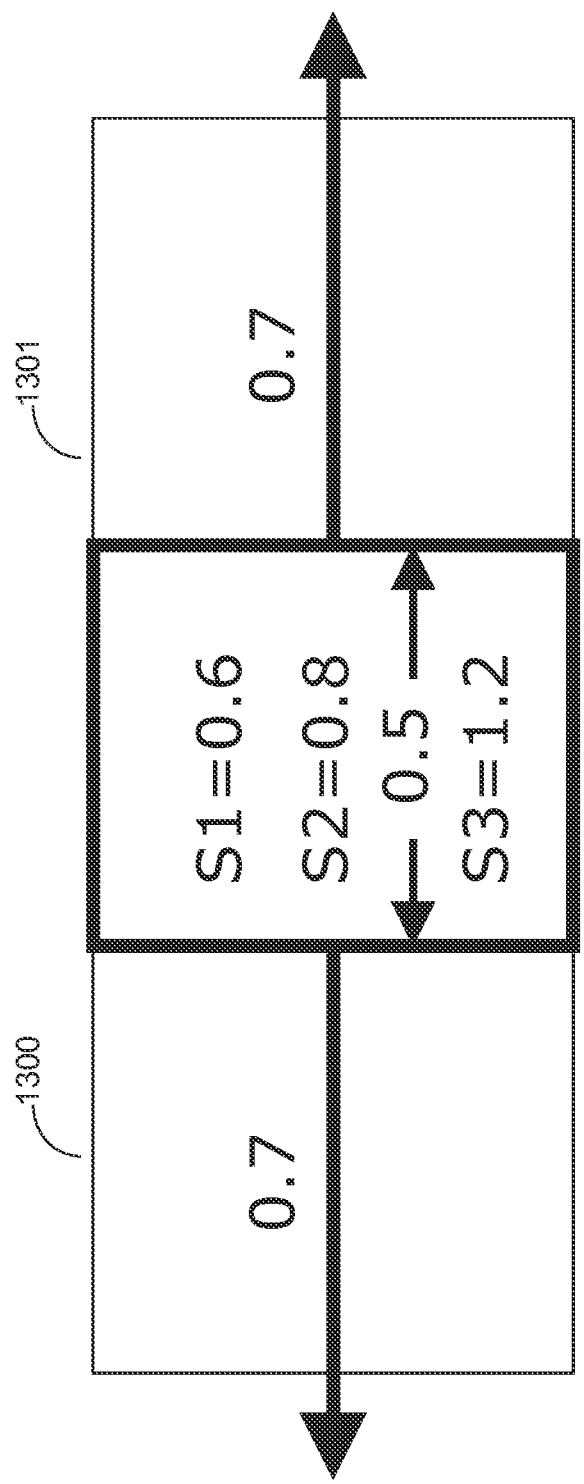
FIG. 13 is a layout diagram of another exemplary circuit with fix guide information displayed associated with multiple spacing rule verification violations for a single set of elements in accordance with an embodiment of the present invention.

In some embodiments, there may be multiple rules or rule sets in a rule deck. The violations of different rules may overlap with others with different fixing distance. In such a case of overlapping violations with different fixing distances, an embodiment of the invention may report only the most useful one to user through selective generation of a fixing guide and particular markers within the guide. For example, with reference to FIG. 13, two metal elements 1300 and 1301 are displayed in an exemplary configuration where they are disposed 0.5 apart from each other. In the example, there are three minimum spacing design rules applicable to this configuration: S1 (minimum spacing of 0.6), S2 (minimum spacing of 0.8), and S3 (minimum spacing of 1.2). Under such a set of design rules in the rule deck and a verification operation where these rules are being verified, the exemplary configuration in FIG. 13 violates S1(0.6), S2(0.8) and S3(1.2) at the same time. However, rather than generating three separate pairs of markers for possible fixing guides, but the embodiment generates and shows only one fixing guide to fix the three violations.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A method for handling violations during verification of a design configuration, the method comprising:
　receiving, at one or more computer systems, information indicative of a first set of geometric shapes for each layer of the design configuration;
　receiving, at the one or more computer systems, information indicative of a set of design rules, each design rule in the set of design rules indicative of a series of one or more primitive operations;
　generating, with one or more processors associated with the one or more computer systems, a second set of geometry shapes for a first layer of the design configuration as a result of one or more primitive operations; and
　generating, with one or more processors associated with the one or more computer systems, a list of fix information for the first layer of the design configuration in response to a verification of the second set of geometry shapes for the first layer of the design configuration based on a first primitive operation and a list of fix information for a second layer of the design configuration generated in response to a verification of a third set of geometry shapes for the second layer of the design configuration based on a second primitive operation that preceded the first primitive operation,
wherein each element in the lists of fix information comprises at least a pair of edges indicative of a verification violation and a displacement needed to resolve that violation.

2. The method of claim 1 wherein generating, with the one or more processors associated with the one or more computer systems, the list of fix information for the first layer of the design configuration comprises pruning elements from the list of fix information for the second layer of the design configuration wherein each pruned element has no edge overlapping any geometry shape in the second set of geometry shapes for the first layer of the design configuration.

3. The method of claim 1 wherein generating, with the one or more processors associated with the one or more computer systems, the list of fix information for the first layer of the design configuration comprises pruning fix information from the list of fix information for the second layer of the design configuration that is irrelevant to the second set of geometry shapes for the first layer of the design configuration.

4. The method of claim 1 wherein generating, with the one or more processors associated with the one or more computer systems, the list of fix information for the first layer of the design configuration comprises determining one or more violations of the set of design rules in response to one or more primitive dimensional checking operations.

5. The method of claim 4 wherein at least one of the one or more primitive dimensional checking operations comprises a minimum width checking operation, a minimum spacing checking operation, or a minimum enclosure checking operation.

6. The method of claim 1 wherein generating, with the one or more processors associated with the one or more computer systems, the second set of geometry shapes for the first layer of the design configuration comprises generating a set of output shapes on an output layer in response to one or more primitive geometrical operations.

7. The method of claim 6 wherein at least one of the one or more primitive geometrical operations include an AND operation specifying an intersection between two sets of shapes on one or two layers, an OR operation specifying a merge between two sets of shapes on one or two layers, a NOT operation specifying a subtraction between two sets of shapes on one or two layers, a SIZING operation specifying a change in size of a set of shapes, or a SELECTION operation specifying a selection of a first set of shapes with respect to a second set of shapes.

8. The method of claim 1 further comprising:
generating, with the one or more processors associated with the one or more computer systems, one or more fix guides based on the list of fix information for the first layer of the design configuration.

9. The method of claim 8 wherein generating, with the one or more processors associated with the one or more computer systems, the one or more fix guides comprises intelligently determining which fix guides to generate based on fix information in the list of fix information for the first layer of the design configuration that renders redundant at least one other fix information in the list of fix information for the first layer of the design configuration.

10. The method of claim 8 further comprising:
determining, with the one or more computer systems, whether first fix information in the list of fix information for the first layer of the design configuration is superseded by second fix information in the list of fix information for the first layer of the design configuration; and
wherein generating, with the one or more processors associated with the one or more computer systems, the one or more fix guides includes a fix guide for the second fix information and not the first fix information.

11. The method of claim 10 wherein determining, with the one or more processors associated with the one or more computer systems, whether the first fix information in the list fix information for the first layer of the design configuration is superseded by the second fix information in the list fix information for the first layer of the design configuration comprises determining that the first fix information identifies a first design rule violation that occurs at the same location as a second design rule violation identified by the second fix information, wherein a fix according to the second fix information to resolve the second design rule violation also resolves the first design rule violation.

12. The method of claim 8 wherein generating, with the one or more processors associated with the one or more computer systems, the one or more fix guides comprises generating information configured to display a one or more pairs of directional arrows associated with a one or more pairs of edges in the second set of geometry shapes for the first layer of the design configuration, each pair of directional arrows indicative of an dimensional amount that will resolve a design rule violation.

13. The method of claim 8 wherein generating, with the one or more processors associated with the one or more computer systems, the one or more fix guides comprises generating one or more fix guides for diagonal spacing violations.

14. The method of claim 13 wherein generating one or more fix guides for diagonal spacing violations comprises:
determining a violation in a first component direction of a diagonal spacing violation and generating a fix guide for that component direction accordingly; and
determining a violation in a second component direction of the diagonal spacing violation and generating a fix guide for that component direction accordingly.

15. The method of claim 8 further comprising:
displaying a fix guide corresponding to at least some elements in the list of fix information for the first layer of the design configuration on a display device.

16. The method of claim 1:
wherein receiving the information indicative of the first set of geometric shapes for each layer of the design configuration comprises storing a plurality of geometric shapes for each layer of the design configuration in a database;
wherein receiving the information indicative of the set of design rules comprises receiving a rule deck;
wherein generating the second set of geometry shapes for the first layer of the design configuration comprises generating output geometry for an output layer; and
wherein generating, with one or more processors associated with the one or more computer systems, the list of fix information for the first layer of the design configuration comprises storing an overall list of fix information after verification wherein for each primitive operation set during verification:
if the primitive operation step is a dimensional checking operation, generating fix information comprising violation edge pairs and adding the generated fix information for the layer to the overall fix information,
for each primitive operative step, generating the output shapes on the output layer and passing fix information on input layers which overlaps any output shape of the output layer to the overall list of fix information.

17. A non-transitory computer-readable medium storing computer-executable code for handling violations during verification of a design configuration, the non-transitory computer-readable medium comprising:
- code for receiving information indicative of a first set of geometric shapes for each layer of the design configuration;
- code for receiving information indicative of a set of design rules, each design rule in the set of design rules indicative of a series of one or more primitive operations;
- code for generating a second set of geometry shapes for a first layer of the design configuration as a result of one or more primitive operations; and
- code for generating a list of fix information for the first layer of the design configuration in response to a verification of the second set of geometry shapes for the first layer of the design configuration based on a first primitive operation and a list of fix information for a second layer of the design configuration generated in response to a verification of a third set of geometry shapes for the second layer of the design configuration based on a second primitive operation that precedes the first primitive operation,
- wherein each element in the lists of fix information comprises at least a pair of edges indicative of a verification violation and a displacement needed to resolve that violation.

18. A system for handling violations during verification of a design configuration, the system comprising:
- a processor; and
- a memory configured to store a set of instructions which when executed by the processor configure the processor to:
    - receive information indicative of a first set of geometric shapes for each layer of the design configuration;
    - receive information indicative of a set of design rules, each design rule in the set of design rules indicative of a series of one or more primitive operations;
    - generate a second set of geometry shapes for a first layer of the design configuration as a result of one or more primitive operations; and
    - generate a list of fix information for the first layer of the design configuration in response to a verification of the second set of geometry shapes for the first layer of the design configuration based on a first primitive operation and a list of fix information for a second layer of the design configuration generated in response to a verification of a third set of geometry shapes for the second layer of the design configuration based on a second primitive operation that precedes the first primitive operation,
- wherein each element in the lists of fix information comprises at least a pair of edges indicative of a verification violation and a displacement needed to resolve that violation.

* * * * *